United States Patent
Risbo et al.

(10) Patent No.: US 7,078,964 B2
(45) Date of Patent: Jul. 18, 2006

(54) DETECTION OF DC OUTPUT LEVELS FROM A CLASS D AMPLIFIER

(75) Inventors: Lars Risbo, Copenhagen (DK); James Teng, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 10/963,239

(22) Filed: Oct. 12, 2004

(65) Prior Publication Data

US 2005/0083116 A1    Apr. 21, 2005

Related U.S. Application Data

(60) Provisional application No. 60/511,743, filed on Oct. 15, 2003.

(51) Int. Cl.
*H03F 3/38* (2006.01)

(52) U.S. Cl. .................. 330/10; 375/238; 332/107; 332/109

(58) Field of Classification Search ............... 375/238; 332/107, 109, 111
See application file for complete search history.

(56) References Cited

U.S. PATENT DOCUMENTS

| 6,567,491 B1 * | 5/2003 | McCune et al. ............ 375/247 |
| 6,771,121 B1 * | 8/2004 | Nilsson et al. ............. 330/10 |
| 2003/0223592 A1 * | 12/2003 | Deruginsky et al. ......... 381/92 |

* cited by examiner

*Primary Examiner*—Robert Pascal
*Assistant Examiner*—Alan Wong
(74) *Attorney, Agent, or Firm*—Alan K. Stewart; W. James Brady, III; Frederick J. Telecky, Jr.

(57) ABSTRACT

A class AD audio amplifier system (10) with DC output detection logic (26) is disclosed. The amplifier system (10) includes multiple audio channels (20), each of which includes a pulse-width-modulator (PWM) (24). The DC detection logic (26) includes a sigma-delta modulator (60) and a digital low-pass filter (62) that monitors the PWM output signals from the PWM modulators (24). The sigma-delta modulator (60) operates at a first clock frequency, while the low-pass filter (62) operates at a much lower clock frequency, so that AC audio components, PWM harmonics, and sigma-delta quantization error is suppressed from the DC detection. The modulated filtered signal is compared against a threshold level (THRSH) to determine whether the amplitude of a DC component at the PWM output is sufficiently high to constitute a fault. If so, a fault detection signal (DC_DET) is issued, and the PWM modulators (24) are disabled to prevent unsafe conditions in the system (10).

28 Claims, 6 Drawing Sheets

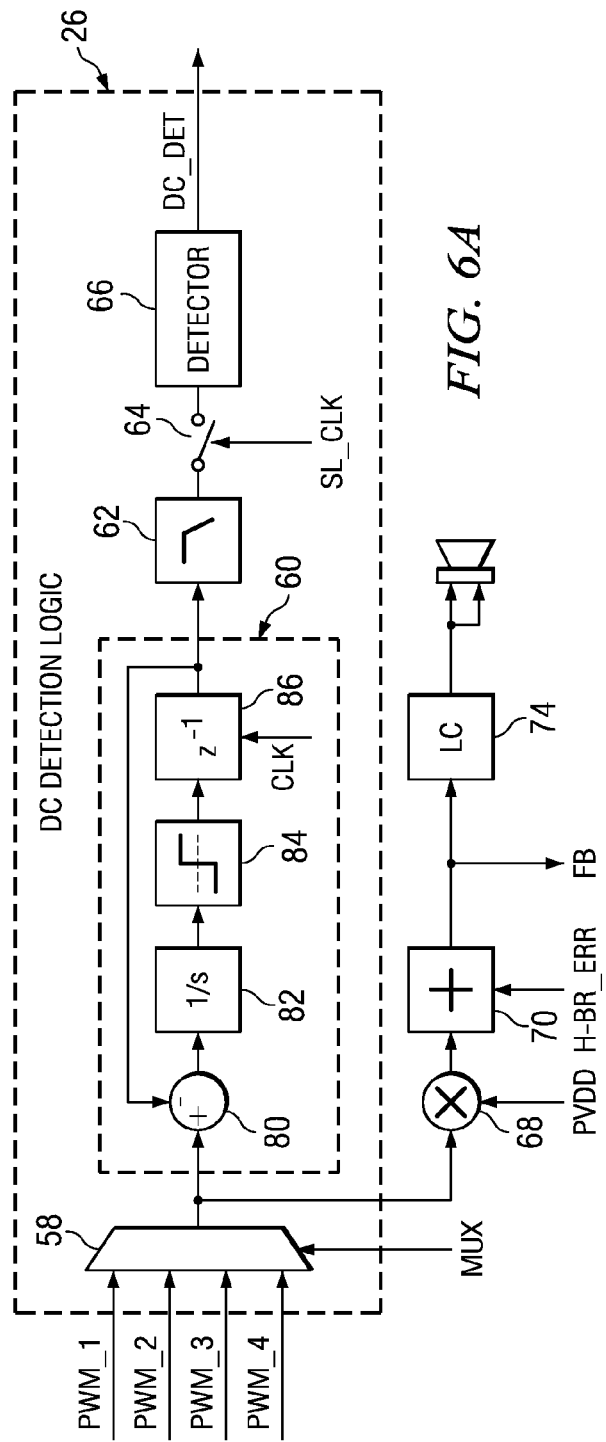
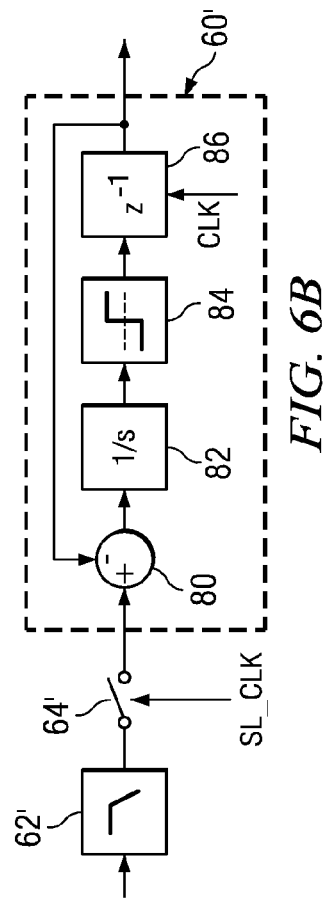
FIG. 6A
FIG. 6B

DETECTION OF DC OUTPUT LEVELS FROM A CLASS D AMPLIFIER

CROSS-REFERENCE TO RELATED APPLICATIONS

This application claims priority, under 35 U.S.C. §119(e), of Provisional Application No. 60/511,743, filed Oct. 15, 2003.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to pulse-width modulated class D audio power amplifiers.

As is fundamental in the art, electronic amplifier circuits are often classified in various "classes". For example, the output drive transistors of class A amplifier circuits conduct DC current even with no audio signal, and the entire output voltage swing is of a single polarity. Class B amplifiers, on the other hand, typically include complementary output drive transistors, driving an output voltage swing including both positive and negative polarity excursions. Class B amplifiers are necessarily more efficient, because both complementary output drive transistors are never on at the same time. Class AB amplifiers maintain a small bias current through complementary output drive transistors, so that the output voltage swing is centered slightly above (or below) ground voltage. While the non-zero bias current renders class AB amplifiers theoretically less efficient than class B amplifiers, class AB amplifiers present avoid the crossover distortion of class B amplifiers.

In recent years, digital signal processing techniques have become prevalent in many electronic systems. The fidelity provided by digital techniques has increased dramatically with the switching speed of digital circuits. In audio applications, the switching rates of modern digital signal processing are sufficiently fast that digital techniques have become widely accepted for audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD or plasma televisions. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

FIG. 1 illustrates the architecture of a conventional class D audio amplifier, specifically a so-called "class AD" audio amplifier with a bridged load. In this conventional audio implementation, audio speaker SPKR is the load, and is bridged between pairs of output transistors 7A, 7C; 7B, 7D. Feedback from the output is also used to generate a negative feedback signal via feedback unit 9. In this architecture, input analog signal IN is received at one end of adder 11, along with this negative feedback signal. Adder 11 presents a difference signal between the input IN and the feedback signal to loop filter 13, which applies transfer function H(s) that establishes the stability of the system and also the extent to which error is suppressed by the feedback loop. The filtered difference signal from loop filter 13 is applied to an input of natural sampling pulse width modulator 1.

Conventional pulse width modulator 1 includes comparator 5, which compares its input signal from loop filer 13 with a triangle wave generated by signal source 3, and applied to the negative input of comparator 5. The triangle waveform is at a period T and a switching frequency $F_{sw}$, as shown. In this example, in which the load SPKR is bridged between output drive transistors, comparator 5 generates complementary, two-level, pulse-width-modulated (PWM) output signals. Referring to the positive output from comparator 5, which is applied to output transistors 7A and 7D, the output signal is at an amplitude of +1 (turning on transistors 7A, 7D) responsive to the filtered input difference signal being instantaneously higher than the current state of the triangle waveform, and at an amplitude of −1 (turning off transistors 7A, 7D) responsive to this input signal instantaneously being lower than the current state of the triangle waveform. The negative output of comparator 5 produces a complementary output signal, turning on and off transistors 7B, 7C. It is known to include some sort of gating or synchronization between the complementary output signals to ensure that both output drive stages are not on at the same time, thus ensuring that "crowbar" current is not drawn.

This conventional amplifier circuit is often referred to as a class "AD" amplifier arrangement, in that a zero input signal (i.e., zero difference signal between input signal IN and the feedback signal, as filtered by loop filter 13) will produce a 50% duty cycle output drive across load SPKR. This class AD arrangement is effected by transistors 7A, 7D being turned on while transistors 7B, 7C are off, so that current flows from left-to-right through load SPKR in one half-cycle, and so that transistors 7B, 7C are on while transistors 7A, 7D are off in the other half-cycle, during which current flows from right-to-left through load SPKR. In this arrangement, the common mode voltage across the bridged load SPKR is zero volts.

By way of further background, other class D amplifier arrangements are also known in the art. One such arrangement is referred to as the class "BD" amplifier, by way of analogy to class B analog amplifiers. In the class BD amplifier, the bridged load is driven by separate modulators. As a result, there are three possible drive states across the bridged load: full positive polarity, full negative polarity, and zero volts. As a result, for zero input signal, no output PWM signals appear at all (i.e., there is zero output, or the PWM output is at a "zero" state).

Class D amplifiers have become attractive for audio applications, especially as the desired output power levels have increased over recent years. The efficiency of class D amplifiers in driving loudspeakers can be higher than 90%, which is much higher than the efficiency provided by conventional analog audio amplifiers. Among other benefits of this improved efficiency, the heat that is dissipated in the drive circuitry is much reduced, and thus the amplifier heat sinks can be much smaller (and thereby lighter). Class D audio amplifiers have thus become quite popular for portable and automotive audio systems.

As mentioned above, conventional class D amplifiers include a loop filter for stabilizing the system and also suppressing error in the feedback loop. By way of further background, copending application Ser. No. 10/846,281, filed May 14, 2004, entitled "Improved Loop Filter for Class D Amplifiers", commonly assigned with this application and incorporated herein by reference, describes a class D amplifier circuit in which the open-loop error for audio band frequencies is improved by a loop filter that has multiple feedback loop paths.

As is well known in the art, typical audio amplifiers have AC-coupled, or capacitively-coupled, inputs, presenting high input impedance at DC to the audio signal source. As a result, in the case of a class D audio amplifier, the output signal will not have a DC component. Especially in automotive applications, the absence of DC voltage at the audio amplifier output is important from a safety standpoint. It has been observed that the dissipation of DC current through a speaker gives rise to a risk of fire in the automobile, especially considering the relatively hostile (including wet) automotive environment through which conductors travel from the audio amplifier to the auto speakers. Accordingly, the AC coupling of the audio amplifier inputs avoids this problem, and is therefore quite beneficial, especially in automotive applications.

However, it has also been observed that the coupling capacitors at the audio amplifier input can be leaky to DC current. This leakage can be due to a manufacturing defect, or may develop over time due to electrical overstress excursions at the input, dielectric or other material breakdown or degradation over time, and moisture or other foreign matter providing a short-circuit path around the coupling capacitor. Leakage through (or around) the input coupling capacitor will translate into a DC component at the audio amplifier output, raising safety and reliability concerns as mentioned above.

By way of further background, conventional circuitry and techniques are known for detecting the presence of a DC component at the output of an audio amplifier. For example, in the general sense, it of course appears that one may simply high-pass filter the output signals of the amplifier in order to eliminate DC components from appearing the output signal. Conversely, one may low-pass filter the audio output in monitoring whether a DC component is present. But in the context of audio amplifiers, frequencies as low as 20 Hz are important in producing high-fidelity audio output. Significant power is required at these frequencies, especially when driving "subwoofers" when playing modern "bass-heavy" popular music. Conventional filters having cutoff frequencies that are this low are of course rather complex and expensive, considering the extremely long time constants required in such filters, which require capacitors that are so large as to not be compatible with modern integrated circuit technology and that therefore must be external to the amplifier.

Accordingly, other conventional approaches to DC detection require muting the audio amplifier during DC detection. While this conventional DC detection approach is effective for some types of defects, it is not able to detect the buildup of a DC output level during operation. It has been observed, in connection with this invention, that this DC buildup can occur during operation, and can give rise to the safety and reliability concerns mentioned above.

BRIEF SUMMARY OF THE INVENTION

It is therefore an object of this invention to provide a DC detection circuit for a class D amplifier.

It is a further object of this invention to provide such a DC detection circuit that can detect DC output buildup during normal operation of the amplifier.

It is a further object of this invention to provide a fail-safe control of a class D audio amplifier, in the event of DC buildup at the amplifier output.

Other objects and advantages of this invention will be apparent to those of ordinary skill in the art having reference to the following specification together with its drawings.

The present invention may be implemented into a class D amplifier, such as in an audio system, having a circuit that detects the presence of a DC component at the pulse-width-modulated output, during the operation of the audio amplifier. The DC detector preferably is constructed as a sigma-delta modulator in combination with a digital low-pass sinc filter that is clocked at a much slower clock rate than the sigma-delta modulator. In this manner, the cutoff frequency of the sinc filter can be extremely low, so that DC output signal components can be detected even in the presence of low frequency components in the audio output during detection. Preferably, the DC detector includes a relatively simple analog portion, with the long filter time constants required for DC detection being handled in the digital domain. Upon the detection of a substantial DC component at the output, the audio amplifier can be shut down, preventing dangerous conditions.

BRIEF DESCRIPTION OF THE SEVERAL VIEWS OF THE DRAWING

FIGS. 6a and 6b are data flow diagrams illustrating DC detection circuitry in the audio amplifier system of FIG. 2, according to preferred embodiments of the invention.

DETAILED DESCRIPTION OF THE INVENTION

The present invention will be described in connection with its preferred embodiment, namely as implemented into an audio system, such as an automobile sound system, as it is contemplated that this invention is especially beneficial in such an application. However, it is also contemplated that this invention will be beneficial in many other applications in which class D amplifiers, or pulse-width-modulators, are applicable. Accordingly, it is to be understood that the following description is provided by way of example only, and is not intended to limit the true scope of this invention as claimed.

Figure 2:
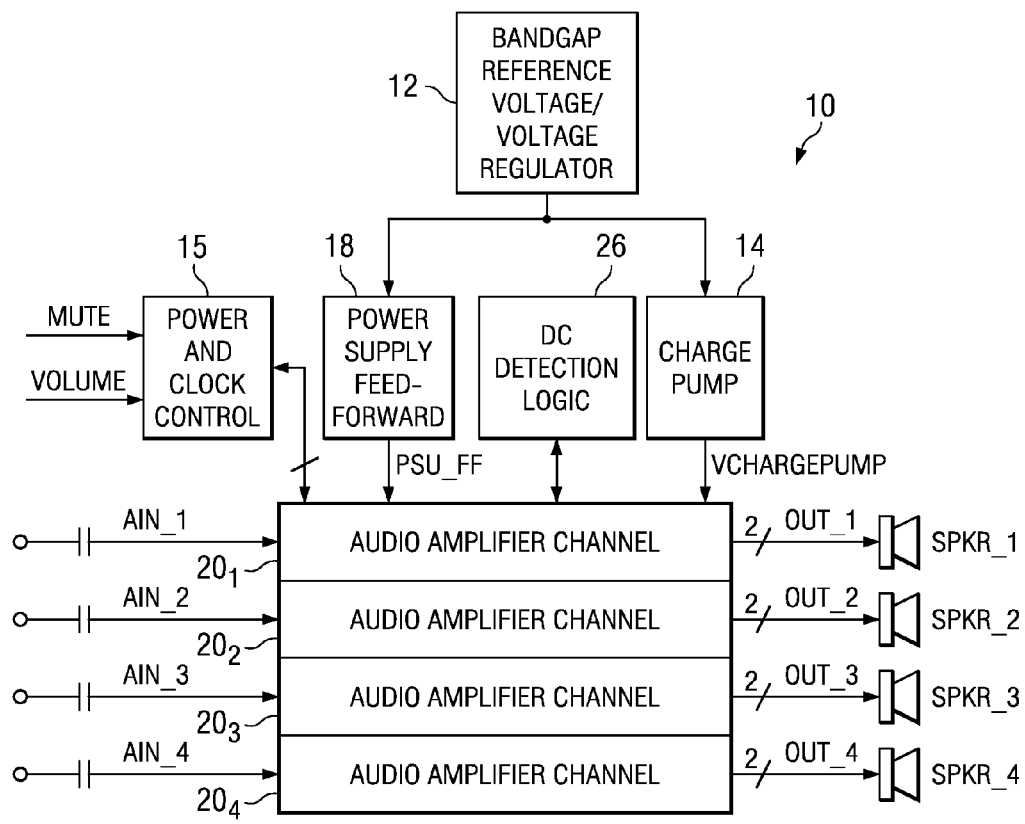
FIG. 2 is an electrical diagram, in block form, of a digital audio amplifier system constructed according to the preferred embodiment of the invention.

FIG. 2 illustrates the construction of digital audio amplifier system 10 constructed according to the preferred embodiment of the invention. In this example, system 10 is capable of driving four output audio channels from four separate analog inputs. It is, of course, contemplated that system 10 may drive more or fewer channels, depending upon the system requirements and specifications. In this example, therefore, each of audio amplifier channels $20_1$ through $20_4$ have inputs that are capacitively coupled to an audio source (not shown), and that receive four analog input signals AIN_1 through AIN_4 respectively. Audio amplifier channels $20_1$ through $20_4$ in turn drive class D output signals OUT_1 through OUT_4, respectively, which drive respective ones of speakers SPKR_1 through SPKR_4. In this embodiment of the invention, speakers SPKR_1 through SPKR_4_ are bridged loads to audio amplifier channels $20_1$ through $20_4$, and as such output signals OUT_1 through OUT_4 include two signals, one from each of two half-bridge outputs for each channel $20_1$ through $20_4$. The combination of the half-bridges applying the output to speakers SPKR_1 through SPKR_4 is often referred to as an "H-bridge", as known in the art. In this specific example, as will become apparent from the following description, audio amplifier channels $20_1$ through $20_4$ are constructed to have class AD output drive characteristics, in which case the output signals OUT_1 through OUT_4 each include complementary output signals from the two half-bridge outputs.

Various control circuitry is also included within system 10 according to this embodiment of the invention. Power and clock control circuitry 15 provides the conventional control functions for digital audio system 10, such functions, including overvoltage and undervoltage detection and protection, detection and control related to other faults in the operation of system 10, clock circuitry for generating the various clock signals used by system 10 and, according to this invention, receipt and processing of mute signal MUTE. Voltage regulator circuit 12, which may include a bandgap or other reference voltage generator circuit, a conventional voltage regulator circuit, or both, provides regulated power supply and regulated reference voltages to the various other functions in system 10, and also to audio amplifier channels 20, in the conventional manner. Charge pump 14 is a conventional charge pump circuit that provides the appropriate voltages to gate drive circuits in the half-bridge outputs of audio amplifier channels 20.

Power supply feed-forward circuit 18 is also preferably provided in system 10. As known in the class D amplifier art, the gain of an H-bridge is proportional to the power supply voltage, while the gate of a pulse-width-modulator is inversely proportional to the amplitude of the reference waveform (e.g., a triangle or sawtooth reference waveform). As a result, the loop gain (i.e., the product of the H-bridge and PWM gains) can undesirably vary with variations in the power supply voltage, causing potential loop stability problems and the introduction of undesired signal modulation. To compensate for this effect, as known in the art, power supply feed-forward circuit 18 forwards the same power supply voltage used to set the amplitude of the reference waveform as the power supply voltage that biases the half-bridge output circuits of audio amplifier channels 20. In this way, any variations in this power supply voltage will appear both at the reference waveform amplitude and also at the output, in which case the loop gain will effectively remain constant over these variations.

According to the preferred embodiment of the invention, as illustrated in FIG. 2, audio system 10 includes DC detection logic 26, which is in communication with each of channels $20_1$ through $20_4$. As will be described in further detail below, DC detection logic 26 determines whether any of the output signals on lines OUT_1 through OUT_4 contains a substantial DC component, and if so, shuts down the operation of all of channels 20. Alternatively, DC detection logic 26 can operate on a channel-by-channel basis (shutting down only the channel causing the DC fault), if desired.

Figure 3:
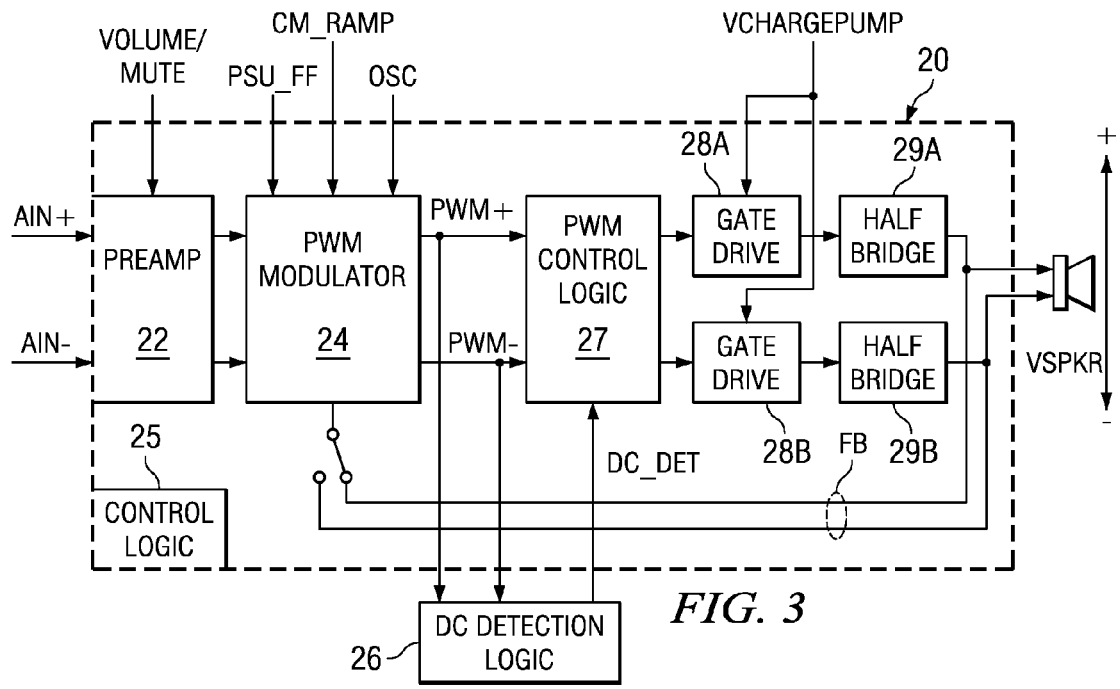
FIG. 3 is an electrical diagram, in block form, of the audio amplifier for an output channel in the digital audio amplifier system of FIG. 2, constructed according to the preferred embodiment of the invention.

Referring now to FIG. 3, the construction of one of audio amplifier channels 20 will now be described in further detail. It is of course contemplated that each of audio amplifier channels $20_1$ through $20_4$ in system 10 will be constructed identically as one another, corresponding to the construction of channel 20 as shown in FIG. 3. Of course, the particular construction of one or more of channels 20 may vary from that shown in FIG. 3, if appropriate for a particular application.

Differential analog input signals AIN+, AIN− are received by audio amplifier channel 20 at preamplifier 22. As will become more apparent from the following description, it is contemplated that audio amplifier channel 20 will typically be implemented in a fully differential fashion, as reflected by the differential analog input signals AIN+, AIN−. However, audio amplifier channel 20 may alternatively be implemented in single-ended fashion if desired, in which case the analog audio input signal would be a single-ended signal (or converted from a differential signal to a single-ended signal within channel 20). It is contemplated that those skilled in the art will be readily able to construct audio amplifier channels 20 in either differential or single-ended arrangements, as desired. The generalized construction of channel 20 illustrated in FIG. 3 is intended to be applicable to either implementation.

Preamplifier 22 includes a preamplifier for amplifying the analog input level for application to PWM modulator 24, to an amplification level corresponding to volume and mute control signal VOLUME/MUTE from power and clock control circuit 15 (FIG. 2), which is in response to a user input. For muting and unmuting of the audio output, of course, the volume and mute control signal effectively gates the output of preamplifier 22 to a zero output level in a muted condition, or to the desired volume output in an unmuted condition. One example of the construction of preamplifier 22 is described in copending application Ser. No. 10/836,067 filed Apr. 30, 2004, commonly assigned herewith and incorporated herein by this reference.

The output of preamplifier 22 is then applied to PWM modulator 24, along with a feedback signal on lines FB. PWM modulator 24 receives a reference waveform on line OSC, from a local oscillator in power and clock control circuit 15, according to which it effects the pulse-width-modulation used to generate the class D output signals.

PWM modulator 24 also receives a power supply voltage on line PSU_FF from power supply feed-forward circuit 18.

Figure 1:
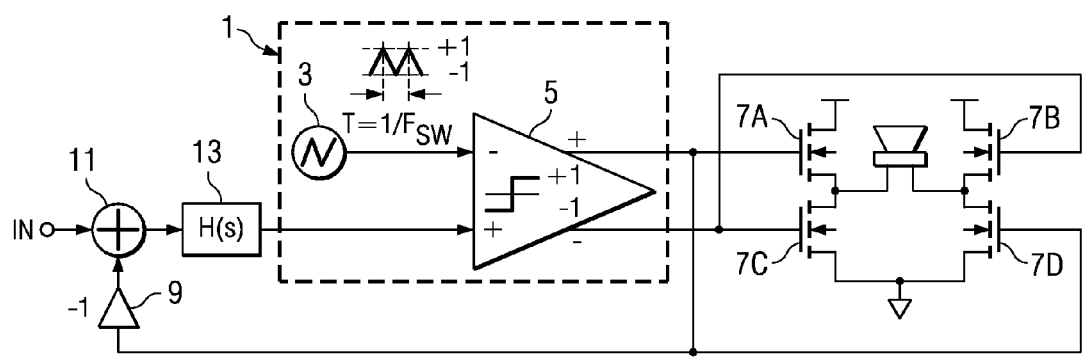
FIG. 1 is an electrical diagram, in schematic form, of a conventional class AD audio amplifier system.

PWM modulator 24 generates a pulse-width-modulated output on a pair of output lines PWM+, PWM− to gate drivers 28A, 28B, respectively. Control logic is provided between PWM modulator 24 and gate drivers 28A, 28B, to process the PWM output from modulator 24 to ensure adequate pulse widths, or to interlock the signals to avoid crowbar output conditions, and the like. Gate drivers 28A, 28B each generate the appropriate output levels to drive the gates of transistors in half-bridges 29A, 29B, respectively. These output levels are controlled by voltage VCHARGEPUMP from charge pump 14 (FIG. 2), in the conventional manner. Half bridges 29A, 29B each include the appropriate power output transistors for driving speaker SPKR in response to the PWM output signal. For example, half-bridge 29A may include a pull-up transistor and a pull-down transistor connected on opposite sides of speaker SPKR to drive current of one polarity when on, similarly as transistors 7A, 7D of FIG. 1. Half-bridge 29B includes opposing pull-up and pull-down transistors driving speaker SPKR with current of the opposite polarity when on, similarly as transistors 7B, 7C of FIG. 1. In this arrangement, each of half-bridges 29A, 29B receive complementary PWM signals, so that the transistors of half-bridge 29A are on when the transistors of half-bridge 29B are off, and vice versa. In this manner, speaker SPKR is driven as a bridged load, in class AD fashion. The signals driven by half-bridges 29A, 29B are also fed back to PWM modulator 24 on lines FB, for application to the modulation process as will be described below.

Also as shown in FIG. 3, DC detection logic 26 operates in combination with channel 20. DC detection logic 26 receives the PWM output signals from PWM modulator 24, in combination with various clock signals (not shown) that are generated by power and clock control circuit 15. As will be described in further detail below, DC detection logic 26 analyzes the PWM output signals from channel 20 (and all other channels 20 in system 10) in order to detect whether a DC level is being presented at any of the loads SPKR. If so, DC detection logic 26 issues a control signal on line DC_DET to PWM control logic 27, in each channel 20, to disable output signals from being applied to gate drivers 28A, 28B and to half-bridges 29A, 29B, thus shutting down channels 20 and preventing a dangerous condition from being developed across their corresponding loads SPKR.

In this example, as shown in FIG. 2, DC detection logic 26 is preferably implemented globally, so that all of channels 20 are controlled if a significant DC component is detected at the output of any one of channels 20. Alternatively, each of channels 20 may include an individual instance of DC detection logic 26, so that DC detection logic 26 disables only the channel 20 that is driving a substantial DC level. Further in the alternative, where each channel 20 has its own instance of DC detection logic 26, the output signal on line DC_DET from DC detection logic 26 in each of channels 20 may be communicated to all of channels 20, so that all channels 20 are shut down in response the detection of a substantial DC level at the output of any one of channels 20.

Figure 4:
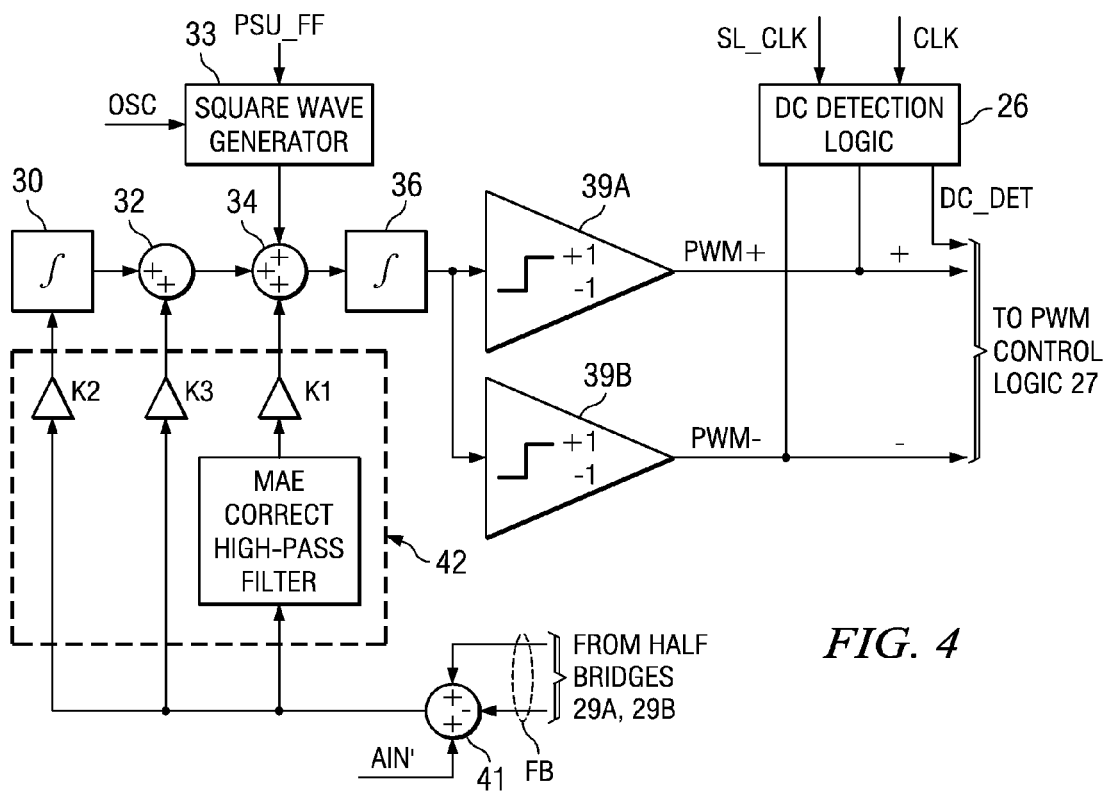
FIG. 4 is an electrical diagram, in block form, of modulator circuitry in an audio channel of the digital audio amplifier system of FIG. 2, constructed according to the preferred embodiment of the invention.

Referring now to FIG. 4, the construction of PWM modulator 24 will now be described, in its operable combination with DC detection logic 26. Analog input signal AIN′, which corresponds to the output of preamplifier 22 (FIG. 3), is received at adder 41. Adder 41 also receives a feedback signal FB from half-bridges 29A, 29B, in the form of a differential voltage driven across load SPKR. The output of adder 41, corresponding to the difference between the input signal AIN′ and the feedback signal FB is applied to loop filter block 40. According to this embodiment of the invention, loop filter block 40 applies filters and gains to this difference signal. As described in further detail in copending application Ser. No. 10/846,281, filed May 14, 2004, commonly assigned herewith and incorporated herein by this reference, the PWM modulator loop filter preferably includes at least one loop path with a transfer function of second order or higher, and at least one loop path in which the maximum negative slope of the magnitude versus frequency for frequencies below the switching frequency is lower than the negative slope of its real part at frequencies above the switching frequency. In the example shown in FIG. 4, the loop filter is realized as a single loop filter involving the combination of loop filter block 40 with first and second integrators 30, 36. In this case, the multiple loop paths preferably operate upon the feedback signal on lines FB from half-bridges 29A, 29B so that the loop filter suppresses distortion from half-bridges 29A, 29B; alternatively, the feedback signal may be derived from the output of PWM control logic 26, or from the output of gate drives 28. Further in the alternative, the loop filter of modulator 24 can be implemented in the conventional manner.

In any event, according to the example of FIG. 4, first integrator 30 receives a filtered difference signal corresponding to the difference between an input signal corresponding to the desired audio output and feedback from the current audio output. First integrator 30 integrates this difference and forwards the result to a sequence of adders 32, 34. Adder 32 adds in another feedback term from loop filter block 40 to the integrated difference from first integrator 30. Adder 34 receives the output of adder 32, adds in another feedback term from loop filter block 40 (preferably including a high-pass filter, as described in copending application Ser. No. 10/846,281), and also adds the reference waveform from square wave generator 33; the sum from the output of adder 34 is then integrated by second integrator 36.

In this embodiment of the invention, the PWM reference waveform is generated by square wave generator 33 in response to a periodic signal presented on line OSC from power and clock control circuit 15 (FIG. 2), having an amplitude corresponding to a voltage communicated on line PSU_FF from power supply feed-forward circuit 18 (FIG. 2). As fundamental in the PWM art, a pulse-width-modulated signal is generally produced from the difference between a periodic sawtooth or triangle waveform and the difference signal. Because the output of adder 34 is applied to second integrator 36 in this embodiment of the invention (and considering that the integral of a square wave is a triangle wave), the reference waveform in this example is applied as a square wave. In addition, because this reference waveform is periodic, it can be either added to or subtracted from the difference signal from adder 32, assuming no DC offset in the reference waveform. And even if DC offset is present in the reference waveform, first integrator 30 will integrate out any resulting DC error, because the reference waveform is injected after first integrator 30.

As shown in FIG. 4, the output of second integrator 36 is applied to comparator 39A, which generates a pulse-width-modulated signal of one polarity, and to comparator 39B, which generates a complementary PWM signal relative to that of comparator 39A. These PWM output signals, which correspond to the output signals to be applied to half-bridges 29A, 29B, are further processed by PWM control logic 27 (FIG. 3). According to the preferred embodiment of the invention, PWM control logic 27 includes at least a gating function that disables the communication of these PWM signals from comparators 39A, 39B to gate drivers 28A, 28B in response to an active level on line DC_DET from DC detection logic 26.

PWM control logic 27 may include other functions besides the shutdown in response to detection of a DC component by DC detection logic 26. One such function is the enforcing of minimum on and off pulse widths for the output signals to be driven to load SPKR. Copending application Ser. No.10/962848, filed Oct. 12, 2004, entitled "SOFT TRANSITIONS BETWEEN MUTED AND UNMUTED STATES IN CLASS D AUDIO AMPLIFIERS", assigned to Texas Instruments Incorporated and incorporated herein by this reference, describes an example of such PWM control logic.

As mentioned above relative to FIG. 3, DC detection logic 26 receives the PWM signals on lines PWM+, PWM− from comparators 39A, 39B, respectively. DC detection logic 26 also receives clock signals on lines CLK, SL_CLK, from power and clock control circuitry 15 (FIG. 2) or alternatively from another clock generation function within system 10. Still further in the alternative, as will be described below, clock signal SL_CLK may be generated from the clock signal on line CLK within DC detection logic 26 itself. The clock signal on line CLK may correspond to the periodic reference waveform on line OSC, if desired. In general, DC detection logic 26 according to the preferred embodiments of the invention includes a relatively simple sigma-delta modulator, for example a first order, 1-bit, sigma-delta modulator, which performs analog-to-digital conversion of the PWM signals. This digital representation is low-pass filtered in the digital domain, with a filter such as a "sinc" (hyperbolic sine) filter with a very long time constant so that AC signals at sub-woofer frequencies are suppressed, along with PWM harmonics and quantization noise from the sigma-delta modulator. Alternatively, the low-pass filter may be applied first, followed by sigma-delta modulation of the filtered signal. In either case, the resulting signal is compared against a selected threshold value that corresponds to the maximum desired DC component at the load (and which may vary with power supply voltage for optimum sensitivity), with a fault indication being triggered if the DC component exceeds the threshold.

More specifically, and as will be described in further detail below, DC detection logic 26 preferably determines the presence of a substantial DC component being driven on lines PWM+, PWM− by PWM modulator 24 by effecting sigma-delta modulation of the PWM signals, and the application of digital sinc filter of a very long time constant (determined by the frequency of the clock signal on line SL_CLK) upon the output of the sigma-delta modulation, with a digital detector determining whether the filtered output indicates a DC level having an amplitude above a selected threshold. If so, DC detection logic 26 issues the control signal on line DC_DET to PWM control logic 27, so that output from the channel 20 is shut down and will not appear at load SPKR.

Figure 5:
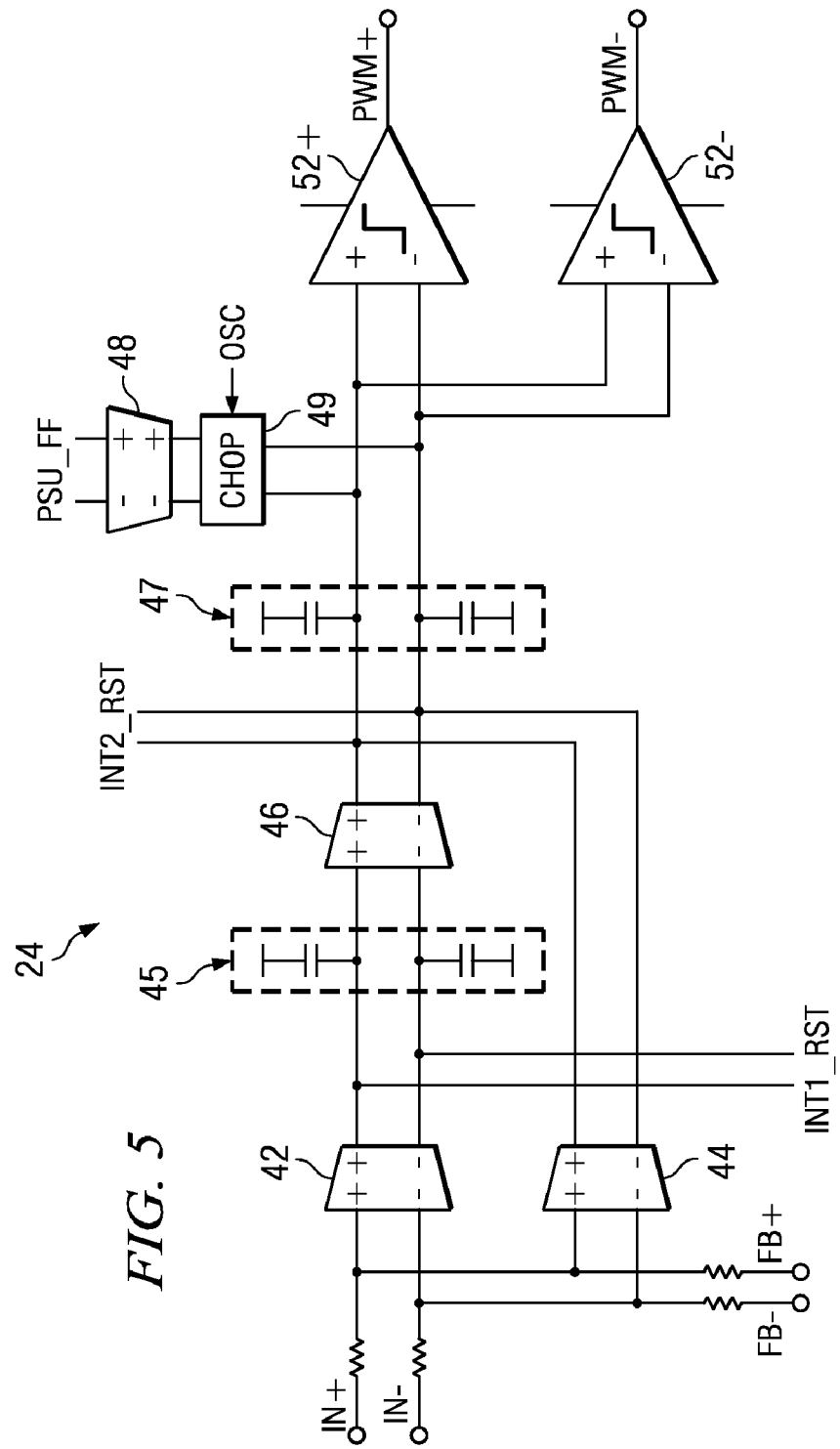
FIG. 5 is an electrical diagram, in schematic form, of a differential implementation of the modulator circuitry of FIG. 4, according to a preferred embodiment of the invention.

FIG. 5 illustrates the construction of PWM modulator 24, according to a fully differential implementation, which is preferred for many applications. Of course, given the functional description of PWM modulator 24 as provided above relative to FIG. 4, it is contemplated that those skilled in the art will be readily able to implement PWM modulator 24 according to other implementations, including a single-ended signal implementation. However, for ease of implementation and also stability of operation, the fully differential implementation of FIG. 5 is preferred, according to this preferred embodiment of the invention.

As shown in FIG. 5, the differential input signal is received on lines IN+, IN− from preamplifier 22, and is applied to the positive and negative inputs of differential operational transconductance amplifier (OTA) 42. OTA 42 may be constructed according to conventional techniques, and as is also known in the art, produces a differential current output in response to the differential voltage received at its input. According to this embodiment of the invention, a differential feedback signal from loop filter block 40 (FIG. 3) is received on lines FB+, FB−, and is applied to the negative and positive inputs of OTA 42, respectively. Because the polarity of the feedback signal on lines FB+, FB− is reversed from that of input signal IN+, IN− as applied to OTA 42, the differential input voltage applied to OTA 42 corresponds to the difference between the input signal and the feedback signal, and thus OTA 42 generates a differential current that corresponds to an error value (i.e., the difference between the desired output, as represented by the differential input voltage, and the current output, as represented by the differential feedback signal).

The output of OTA 42 is applied to first integrator 45. Because the difference signal at the output of OTA 42 is a differential current, first integrator 45 is implemented by way of a pair of capacitors, each connected between one of the outputs of differential OTA 42 and a reference voltage, thus producing a differential voltage (the voltage across the integrating capacitors corresponding to the integral of the charging current over time). This integrated difference current, in the form of a differential voltage, is applied to the differential input of OTA 46, which produces a differential current at its output that corresponds to the integration of the difference current from OTA 42. The output of OTA 46 is applied to second integrator 47, which is also implemented by way of parallel capacitors coupled to the differential output lines from OTA 46.

As mentioned above, the loop filter of PWM modulator 24 in this preferred embodiment of the invention, as described in detail in copending application Ser. No. 10/846,281, involves multiple feedback loop paths. As such, OTA 44 receives a differential voltage corresponding to the difference between the input voltage (IN+, IN−) and the feedback voltage (FB+, FB−), and applies a differential current to second integrator 47, along with the integrated difference current produced by OTA 46.

According to this preferred embodiment of the invention, reset signals INT1_RST, INT2_RST are applied to first and second integrators 45, 47, respectively. These reset signals effectively discharge first and second integrators 45, 47 upon power-up or some other event in which the PWM outputs are expected to be quite different from, and have no relation to, the input signal. In this way, the previous condition of PWM modulator 24 is removed, reducing the latency in PWM modulator 24 in reaching the appropriate desired output state after reset.

The pulse-width-modulation reference signal is also applied to the summing node at second integrator 47. According to this embodiment of the invention, feed-forward power supply voltage PSU_FF is applied, as a differential voltage signal, to OTA 48, which in turn generates a differential current corresponding to the desired amplitude of the reference waveform. Chop circuit 49 chops this differential current from OTA 48 at a frequency determined by a periodic signal received on line OSC from power and clock control circuitry 15 (FIG. 2). The output of chop circuit 49, therefore, is a differential current in the form of a square wave, at the frequency defined by the signal on line OSC, and at an amplitude that corresponds to the feed-forward power supply voltage PSU_FF. This differential square wave current is applied to the summing nodes at second integrator 47, along with the sum of the output of OTA 46 and the feedback signal from OTA 44.

The summed currents are integrated by second integrator 47 to establish a differential voltage that is applied to the inputs of comparator 52+, and (in a reversed polarity) to the inputs of comparator 52−. Comparators 52+, 52− are conventional differential comparators, for comparing the level at its input against a reference level, and generating a full-scale output level on its output lines PWM+, PWM−, respectively. Considering that comparators 52+, 52− have their inputs connected to second integrator 47 in reverse polarity relative to one another, the outputs of comparators 52+, 52− will be logical complements of one another.

In steady-state normal operation, a differential analog input voltage from preamplifier 22 is received at OTAs 42, 44, along with a differential feedback voltage from loop filter 40. The difference current at the output of OTA 42 is integrated by first integrator 45, and applied to OTA 46, which generates a differential current corresponding to the integration of the difference current from OTA 42. This integrated difference current is summed with second-order feedback from OTA 44, and with the reference waveform, in the form of a square wave of differential current from chop circuit 48 at the frequency of the signal on line OSC. Those skilled in the art will recognize that, for purposes of pulse-width-modulation, the addition of a differential periodic waveform to a differential signal that is time-varying at a much lower frequency than the periodic waveform, with both signals at the same DC level (e.g., ground) results in a summed signal that is equivalent to the difference signal that would result if the signals were subtracted from one another. In effect, a 180° phase shift in the much higher-frequency reference waveform would not substantially change the resulting signal.

The signal at the summing nodes at the output of OTA 46 is integrated by second integrator 47, and the resulting differential voltage is applied to comparators 52+, 52−. This differential voltage corresponds to the integral of a second-order difference signal that is compared with a periodic reference signal. This differential voltage is a periodically varying signal, of both polarities. Comparator 52+ thus generates a pulse-width-modulated output signal at a fundamental frequency set by the reference waveform frequency at line OSC, and that is at a high level during the time that the differential voltage is positive and at a low level during the time that the differential voltage is negative. According to this embodiment of the invention, if the input signal IN+, IN− is significantly higher than the feedback signal FB+, FB−, a large difference current will propagate through PWM modulator 24, and will cause a pulse-width-modulated signal of a duty cycle higher than 50% at the output of comparator 52+ on line PWM+.

Conversely, comparator 52− has its input cross-coupled to the differential voltage at second integrator 47, and as such generates a pulse-width-modulated signal at line PWM− that is complementary relative to the signal at line PWM+ at the output of comparator 52+. In the example where the input signal IN+, IN− is significantly higher than the feedback signal FB+, FB−, the large positive polarity difference current will cause a pulse-width-modulated signal at duty cycle less than 50%, at the output of comparator 52− on line PWM−. And, in class AD fashion, a zero level input signal will, in the steady state, result in complementary PWM signals on lines PWM+, PWM− that are both at a 50% duty cycle.

Referring now to FIG. 6*a*, the functional data flow of DC detection logic 26 according to a first preferred embodiment of the invention will be described. In this example, DC detection logic 26 is implemented globally within system 10, with a single instance of DC detection logic 26 monitoring each of channels 20, and shutting down all of channels 20 in response to any one of channels 20 driving a substantial DC level at its output. Alternatively, as mentioned above, individual instances of DC detection logic 26 may be implemented in each of channels 20, if desired.

According to this preferred embodiment of the invention, DC detection logic 26 includes input multiplexer 58, which receives PWM signals PWM_1 through PWM_4 from channels $20_1$ through $20_4$ in system 10. PWM signals PWM_1 through PWM_4 may be single-ended or differential signals, depending on the particular implementation of the PWM modulators 24 in channels 20. Control signal MUX, which may be generated by control circuitry or, as will be described in connection with a particular implementation described in further detail below, by the low pass digital filter circuitry of DC detection logic 26 itself, controls the selection of which input signal PWM_1 through PWM_4 is processed by DC detection logic 26 in a particular time period.

In the arrangement of FIG. 6*a*, the PWM signal selected by multiplexer 58 is applied to sigma-delta modulator 60, which in this case is of first order, and generates a single bit output per modulation. In the arrangement of FIG. 6*a*, sigma-delta modulator 60 includes difference function 80, which produces a signal corresponding to the current input signal selected by multiplexer 60 and a feedback value from the output of sigma-delta modulator 60. This difference signal is applied to integrator block 82, and the output of integrator block 82 is quantized by quantizer 84. The quantized result is then applied to delay stage 86, which is clocked by clock signal CLK (which is the faster clock signal in this implementation, as will become apparent from the following description). The output of delay stage is forwarded to low-pass filter 62, and is also fed back to difference function 80.

Low-pass filter 62 is a digital filter with a very low cutoff frequency, preferably below the lowest audible frequency to be output by any of channels 20 in system 10. The output if digital low-pass filter 62 is sampled via sampling switch 64, which is clocked by slow clock signal SL_CLK. Preferably, slow clock signal SL_CLK is at a very low frequency relative to clock signal CLK that operates sigma-delta modulator 60, for example a slower frequency by a factor of $2^8$ to $2^{16}$, to effect the desired cutoff frequency. This cutoff frequency is preferably sufficiently low so that all important audio components (including extremely low audio frequencies), PWM harmonics, and also quantization noise from quantizer 84, are all suppressed while passing components at or very near DC.

Detector 66 compares the sampled filtered digital signal from sampling switch 64, and compares the signal with a threshold level, issuing an active signal on line DC_DET if the signal exceeds that threshold. The threshold may be adjusted according to the power supply voltage of system 20, to optimize the sensitivity of the DC detection.

FIG. 6*b* illustrates, by way of a data flow diagram, an alternative architecture for DC detection logic 26. In the example of FIG. 6*b*, analog low-pass sinc filter 62' is applied to the selected PWM signal from multiplexer 58 (not shown), with the output of filter 62' sampled by sampling switch 64' using the low frequency clock signal SL_CLK. This sampled signal is then applied to sigma-delta modulator 60', which is constructed similarly as described above relative to FIG. 6a, and produces a 1-bit discrete time output that is equivalent to the output applied to detector 66 in the example of FIG. 6a. Either arrangement may be used in DC detection logic 26 according to the preferred embodiment of the invention, although it is contemplated that it is preferred to effect the long time constant low pass filter in the digital domain, as in the architecture of FIG. 6a.

Referring back to FIG. 6a, the PWM output of multiplexer 58 is modeled as it is applied to load SPKR. As shown in the data flow diagram of FIG. 6a, the PWM output signals are effectively multiplied by power supply voltage PSU_FF at multiplier 68 (which occurs at gate drivers 28A, 28B), and is summed with an error resulting from the H-bridge of half-bridges 29A, 29B, shown at adder 70 in FIG. 6a. The resulting signal is forwarded as feedback to PWM modulator 24 on lines FB, as shown in FIG. 6a, and is also applied to load SPKR, which effectively applies an LC filter 74 to the driven signal. The signal $x_{DC}$ that is applied to sigma-delta modulator 60 relates to the output signal $V_{out}$ applied to load SPKR (and LC filter 74) as follows:

$$x_{DC} = \frac{V_{out} - V_{HBerr}}{V_{PSU\_FF}}$$

where voltage $V_{HBerr}$ is the H-bridge error signal at adder 70, and where voltage $V_{PSU\_FF}$ is the power supply voltage applied to multiplier 64. However, it has been observed, according to this invention, that the error voltage $V_{HBerr}$ (which is typically due to finite switch resistance or dead time) does not significantly affect the detection of DC levels at the output, because this error voltage is generally of lower magnitude than the typical DC detection threshold, and also typically has only AC components. In addition, as evident from this equation, the signal $x_{DC}$ that is monitored for DC components by DC detection logic 26 depends on the power supply voltage PSU_FF. According to the preferred embodiments of the invention, therefore, the DC detection threshold is preferably adjusted to follow variations in the power supply voltage PSU_FF, permitting DC detection logic 26 to accurately detect DC levels by monitoring the logic level PWM signals rather than the high power output at the H-bridge. The design requirements and constraints on DC detection logic 26 are greatly eased by allowing logic level inputs, and noise effects from the H-bridge are also avoided. Alternatively, DC detection logic 26 can monitor the DC components at the output of the H-bridge, in which case any error voltage $V_{HBerr}$ would not affect the measurement, nor would the DC level vary with the power supply voltage. However, the benefits of monitoring the PWM output for DC components are so significant as to be the preferred approach, as will be evident from the description below relative to FIG. 8.

Figure 7A:
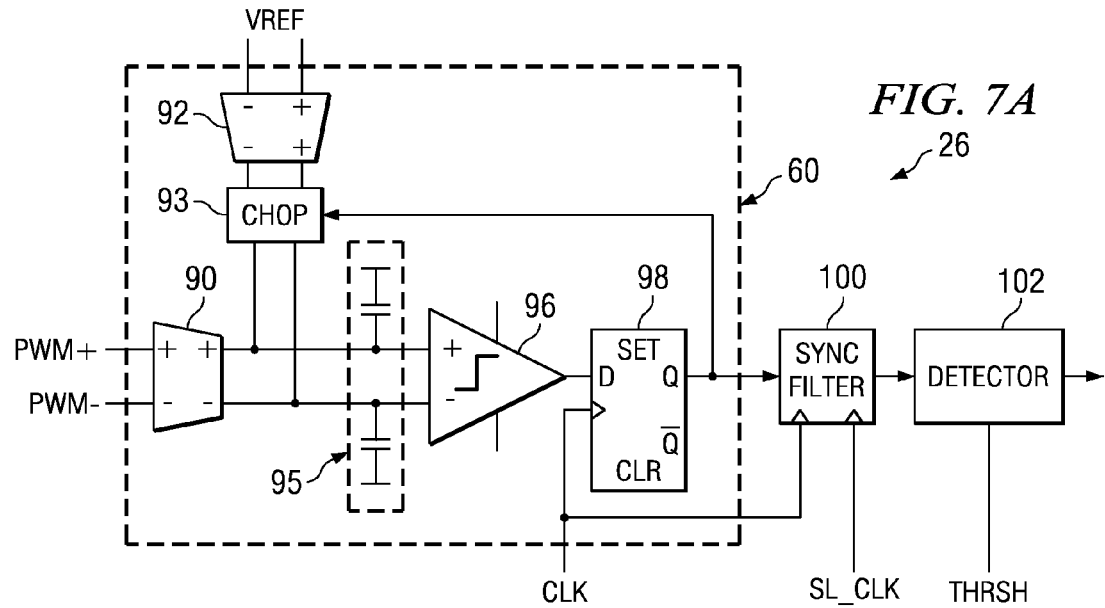
FIGS. 7a and 7b are electrical diagrams, in block and schematic form, of DC detection logic according to preferred embodiments of the invention.

Referring now to FIG. 7a, the construction of DC detection logic 26 according to a first preferred embodiment of the invention will now be described in detail. In the example of FIG. 7a, the selected PWM signal from multiplexer 58 (not shown) is a differential signal across lines PWM+, PWM−, consistent with the fully differential implementation of PWM modulator shown in FIG. 5 and discussed above. Lines PWM+, PWM− are received at the differential input of OTA 90. The differential output from OTA 90, which is a differential current, is summed with a square wave signal generated by chop circuit 93, having an amplitude corresponding to a reference voltage VREF applied to OTA 92; the output of OTA 92 is applied to chop circuit 93. The output of chop circuit 93 depends on the output of the sigma-delta modulator, as will be described below. In any event, the square wave from chop circuit 93 is summed with the differential output of OTA 90 that corresponds to the PWM signals being analyzed, and this difference signal corresponds to the difference signal output by function 80 of FIG. 6a. This difference signal is applied to integrator 95, which again is constructed by a pair of capacitors, each connected between one of the differential output lines from OTA 90 and a reference voltage. Integrator 95 corresponds to integrator 82 of FIG. 6a. These nodes are also applied to the differential inputs of comparator 96, which operates as comparator 84 of FIG. 6a by generating a digital output corresponding to the polarity of the integrated differential signal at its inputs. The output of comparator 96 is applied to the D input of flip-flop 98, which is clocked by clock signal CLK. The Q output of flip-flop 98 is forwarded to sinc filter 100, and is also fed back to control chop circuit 93 as mentioned above.

Sinc filter 100 is clocked both by the higher frequency clock on line CLK, and also by the slower frequency clock on line SL_CLK. Sinc filter 100 applies a low pass digital filter to the output of flip-flop 98, and applies its filtered output to detector 102, which compares the output of filter 100 against a threshold value THRSH. If the sinc filter 100 outputs a signal exceeding the threshold value, detector 102 issues an active level on line DC_DET.

Figure 8:
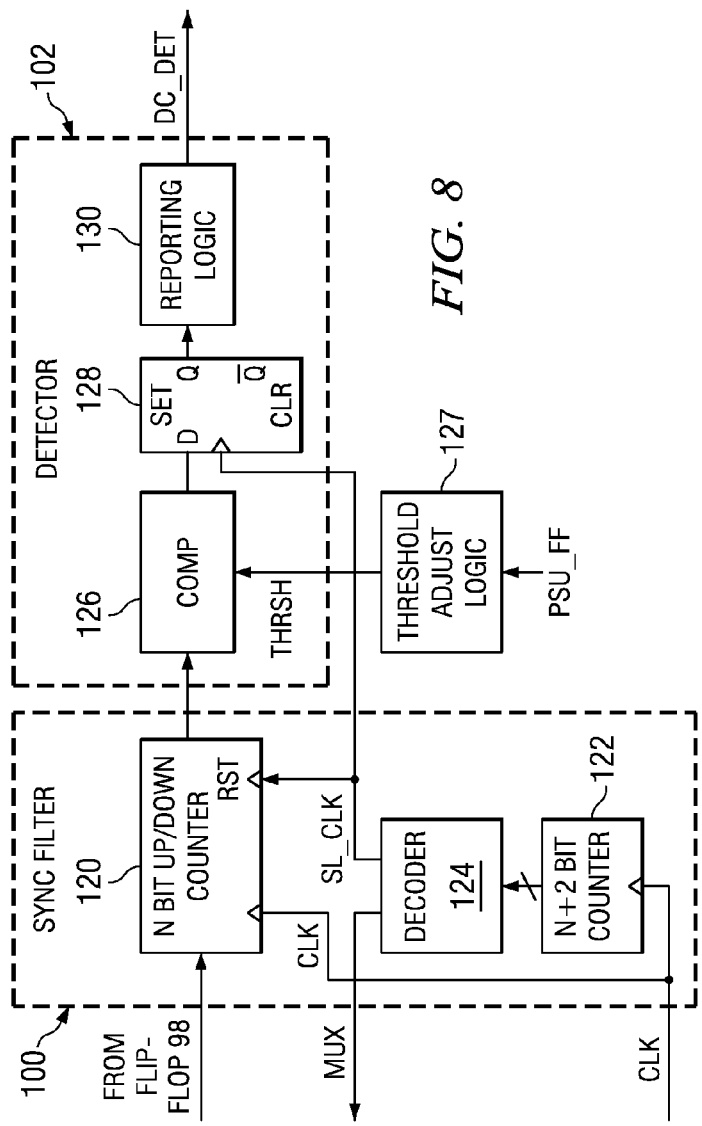
FIG. 8 is an electrical diagram, in schematic form, of a digital low-pass filter in the DC detection logic of the preferred embodiments of the invention.

FIG. 8 illustrates the construction of sinc filter 100 and detector 102, according to a preferred embodiment of the invention. As shown in FIG. 8, the output of flip-flop 98 is received at an input of N bit up/down counter 120. As known in the art, counter 120 advances its count when clocked by clock signal CLK with the output of flip-flop 98 at a high level, and reduces its count when clocked if the output of flip-flop 98 is low. The output of up/down counter 120 is applied to detector circuit 126 in detector 102, as shown.

Control of various functions is effected in response to clock signal CLK, which clocks in the state at the output of flip-flop 98 into up/down counter 120. Clock signal CLK is also applied to N+2 bit counter 122, which presents a digital word output to decoder 124 as shown. As such, N+2 bit counter 122 counts at the clock rate at clock signal CLK, but because it has two more bits than the capacity of counter 120, wraps around at one-fourth the rate of counter 120. These extra two bits correspond to the number of channels 20 being handled by system 10; conversely, if eight channels are being managed, counter 122 would be an N+3 bit counter, relative to counter 120. According to this preferred embodiment of the invention, the two most significant bits of the count in counter 122 are presented on lines MUX to multiplexer 58, while the least significant bits of the count in counter 122 are forwarded to decoder 124.

Decoder 124, according to this embodiment of the invention, includes an internal trip point that is set at a selected value (e.g., all ones) of the N least significant bits of counter 122. Upon this least significant portion of the output from counter 122 reaching the trip point of decoder 124, the low frequency clock signal SL_CLK is applied by decoder 124 to the reset input of counter 120, to reset the contents of counter 120 to a starting value (e.g., in the middle of its range) and to the clock of D flip-flop 128 in detector 102.

The output of counter 120 is applied to comparison logic 126 in detector 102. Comparison logic compares the contents of counter 120 against a digital threshold value on lines THRSH to determine whether these contents that level. Preferably, the threshold value on lines THRSH is adjusted, by threshold adjust logic 127 in this example, in response to variations in the power supply voltage PSU_FF; in this way, the sensitivity of the DC detection is automatically adjusted according to the current power supply voltage. Because DC detection logic 26 is looking for DC levels of either polarity, the comparison effected by comparison logic 126 is preferably constructed accordingly. The output of comparison logic 126 is an indicator bit forwarded to the D input of flip-flop 128, which is clocked by the low frequency clock signal on line SL_CLK. The Q output of flip-flop 128 is presented to reporting logic 130, which generates signals on line DC_DET as shown, and which may also generate other reporting signals, or store the results of the DC detection operation over time, as desired.

While a single order sinc filter 100 is described above relative to the preferred embodiments of the invention, it is of course contemplated that higher order sinc filtering can be used. It is further contemplated that those skilled in the art, having reference to this specification, can readily derive such a filter.

Referring to FIGS. 7a and 8 in combination, the operation of DC detection logic 26 according to this preferred embodiment of the invention will now be described, for the case of a single PWM output signal (i.e., for one state of multiplexer 58). The differential PWM signal on lines PWM+, PWM– for the selected channel is applied to the differential input of OTA 90. According to the preferred embodiment of the invention, this PWM signal is that produced at the output of PWM modulator 24 and that is applied to gate drivers 28A, 28B; alternatively, these signals may be the output of gate drivers 28A, 28B. DC detection logic 26 according to this invention thus does not require the full power H-bridge levels for an input, which greatly facilitates its construction and operation, and also reduces system noise. OTA 90 in turn generates a differential current, as a continuous-time signal, at the summing nodes at its output. This differential current is summed with a differential signal produced by chop circuit 93, under the control of the Q output of flip-flop 98; as a result, the summed current at these summing nodes is a difference signal between the input to and output from sigma-delta modulator 60, in the usual fashion. This difference signal is integrated by integrator 95, and applied to the differential input of comparator 96, which produces a digital output corresponding to the polarity of the integrated difference. This digital output is clocked into D flip-flop 98 with each cycle of clock signal CLK.

The output of sigma-delta modulator 60 in this example thus corresponds to a digital bit stream, at a sampling rate corresponding to clock signal CLK, indicating the relationship of the PWM output for channel 20 to a reference level (e.g., ground, for a bipolar PWM output). If the PWM output is consistently above the reference level, as it would be if a positive polarity DC component were present, the output of sigma-delta modulator 60 would be heavily weighted toward "1" levels; conversely, if a negative polarity DC component was present in the PWM output, the sigma-delta modulator 60 output would be heavily weighted toward "0" levels. This output is presented to sinc filter 100.

As described above relative to FIG. 8, the output of flip-flop 98 of sigma-delta modulator 60 determines the direction in which up/down counter 120 of sinc filter 100 counts in response to each cycle of clock signal CLK. As such, up/down counter 120 accumulates a value that indicates the relative weighting of "1" and "0" levels over time; the absence of a DC component in the PWM output would, over a sufficient number of cycles, result in counter 120 maintaining a value at about the value to which it is reset. Conversely, the contents of counter 120 will stray from this reset value if substantially more "1" bits than "0" bits, or vice versa, are received from flip-flop 98. These contents are forwarded, each cycle, to comparison logic 126 in detection logic 102, for comparison against the threshold value on line THRSH. Meanwhile, counter 122 is advancing its count with each cycle of clock signal CLK. Upon reaching the trip value, decoder 124 advances the control signal on line MUX to select the next channel 20 for analysis, resets up/down counter 120, and clocks the current state at the output of comparison logic 126 into flip-flop 128.

Figure 9:
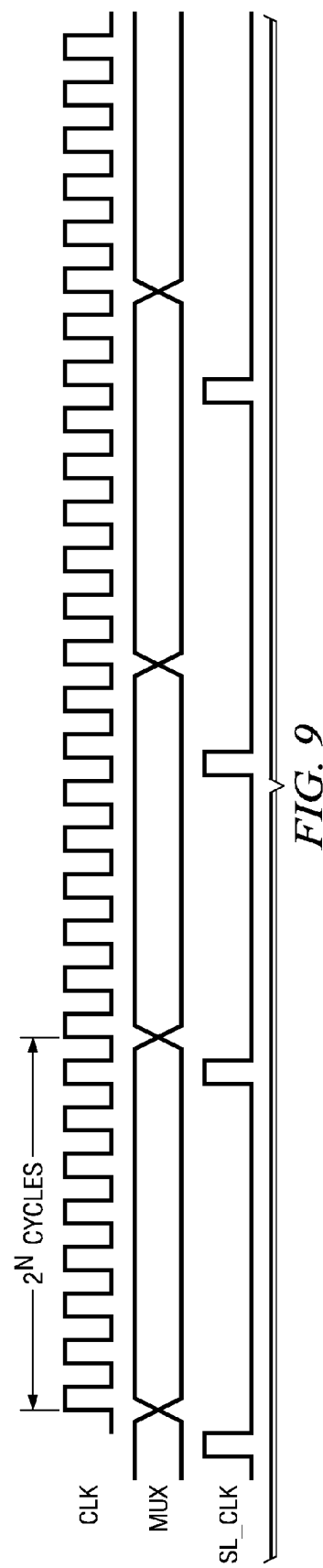
FIG. 9 is a timing diagram illustrating the timing of signals in the DC detection logic according to preferred embodiments of the invention.

Preferably, the number of cycles of clock signal CLK that results in a resetting of counter 120 and the clocking of flip-flop 128 is quite large. This permits the contents of counter 120 to build up (or build down) over a large number of cycles if a substantial DC offset is present in the PWM signal. This number of cycles also preferably corresponds to the size of counter 120, so that the counter does not wrap-around and thus give a false result. An example of the relationship among the cycles of clock signal CLK and low frequency clock signal SL_CLK is illustrated in FIG. 9, in which one pulse of clock signal SL_CLK is issued every $2^N$ cycles of clock signal CLK; a transition in the state of the control signal MUX also issues at this point. In one example, up/down counter 120 is a sixteen-bit counter, in which case decoder 124 issues the clock on line SL_CLK once for every $2^{16}$ cycles of clock signal CLK. As a result, the sampling effected by flip-flop 128 can be at a very low frequency (e.g., on the order of a few Hertz), which implements a cutoff frequency that is also very low, suppressing all important AC audio frequency components, PWM harmonics, and quantization noise from comparator 96, from affecting the DC detection function of this circuit.

In the event of a substantial DC component in the PWM signal, comparison logic 126 will be issuing a high logic level at its output at the time that the clock on line SL_CLK is issued, latching the high level into flip-flop 128 and communicating this result to reporting logic 130. This detection result causes a fault signal to be generated on line DC_DET, in response to which PWM control logic 27 in each of channels 20 is shut down, as described above. Reporting logic 130 may store an indication of which channel 20 caused the fault, if desired, although as described above, it is preferred that all channels 20 are shut down if any one channel 20 develops a substantial DC level at its output.

Figure 7B:
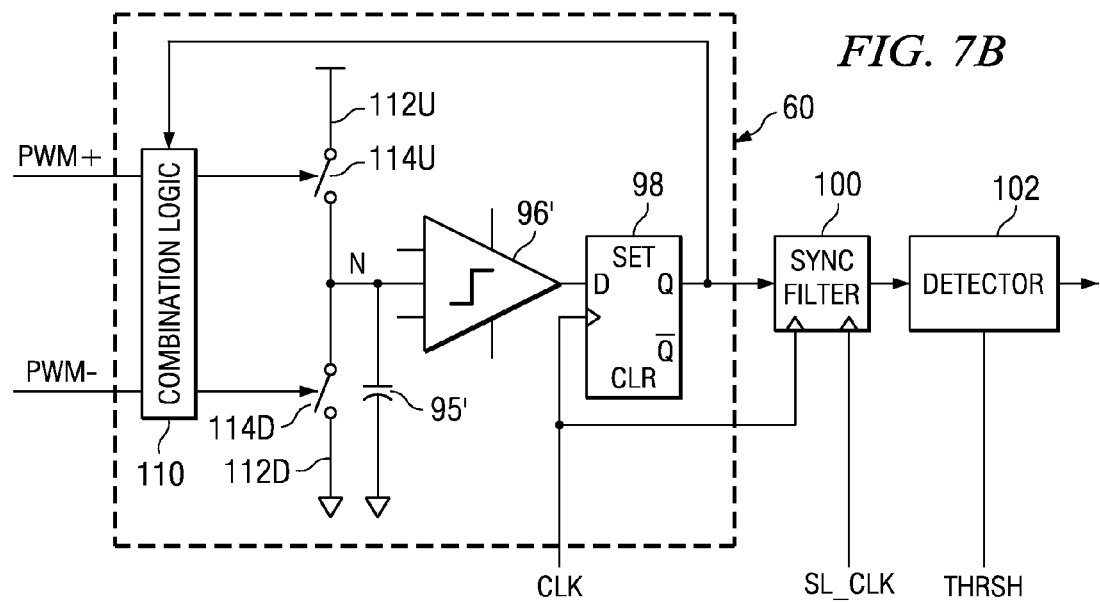

Referring now to FIG. 7b, the construction of sigma-delta modulator 60 according to another preferred embodiment of the invention will now be described. This construction eliminates much of the analog circuitry from that illustrated in FIG. 7a, while still effecting sigma-delta modulation upon a continuous time signal.

As shown in FIG. 7b, combinational logic 110 receives the selected PWM signals, and also receives a feedback signal from the output of sigma-delta modulator 60 (specifically flip-flop 98, as in the case of FIG. 7a). Combinational logic 110 is contemplated to be relatively simple logic for generating a pair of digital outputs in response to the current state of the differential PWM signals on lines PWM+, PWM– and the feedback signal. These digital outputs control the states of switches 114U, 114D, which selectably couple current sources 112U, 112D to summing node N. Integrating capacitor 95' is connected between summing node N and ground; comparator 96' also receives summing node N at its input. Current source 112U is connected between switch 114U and a power supply voltage, while current source 112D is connected between switch 114D and ground. Accordingly, switches 114U, 114D control whether integrating capacitor 95' is being charged by current source 112U, or discharged by current source 112D.

Comparator 96' is a single-ended comparator, for comparing the voltage at summing node N to a reference level. The output of comparator 96' is connected to the D input of flip-flop 98, which is clocked by clock signal CLK and presents its Q output to sinc filter 100 as before. The Q output of flip-flop 98 is coupled back to combinational logic 110, as mentioned above.

In operation, combinational logic 110 controls switch 114U to connect current source 112U to summing node N in response to the PWM signal generating a positive level in combination with a low level at the Q output of flip-flop 98, and controls switch 114D to connect current source 112D to summing node N in response to the PWM signal at a negative polarity in combination with a high level at the Q output of flip-flop 98. If the PWM signal matches, in polarity, the logic state at flip-flop 98, neither of switches 114U, 114D are closed; the state of summing node N is maintained by capacitor 95' in that condition.

Upon the voltage of summing node N and integrating capacitor 95' accumulating to a voltage exceeding the reference voltage at comparator 96', comparator 96' presents a "1" logic level to flip-flop 98, which is clocked in at the next cycle of clock signal CLK. Conversely, if the voltage at summing node N falls below the reference voltage, comparator 96' issues a "0"logic level to flip-flop 98, which is clocked in at the next clock signal CLK cycle. This bit stream output of sigma-delta modulator 60 is applied to low-pass sinc filter 100, for low-pass filtering in the manner described above.

It is contemplated that the construction of sigma-delta modulator 60 is a very simple yet accurate approach for DC detection logic 26 in many instances and applications, especially by eliminating operational transconductance amplifiers, and the like.

According to these preferred embodiments of the invention, therefore, circuitry for detecting the buildup of a DC component at the output of audio amplifiers is provided. The DC detection circuitry according to this invention can operate during normal operation of the audio amplifier system, thus providing protection that conventional DC detection circuitry cannot. In addition, the DC detection function provided according to this invention has no effect on the fidelity of the audio output, even on extremely low subwoofer frequencies, while not requiring complex analog filters or the large passive components that are conventionally required for long time constant filtering. Improved safety in the operation of audio amplifier systems, especially in harsh and hostile environments such as automotive sound systems, is therefore provided.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An amplifier, comprising:
    a pulse-width-modulator, having a capacitively-coupled input for receiving an input signal, and having an output for presenting a pulse-width-modulated output signal; and
    DC detection logic, coupled to the output of the pulse-width-modulator, for generating a fault signal responsive to a DC component being present in the pulse-width-modulator output signal, comprising:
        a sigma-delta modulator, operating at a first clock frequency, for generating a modulated bitstream corresponding to the pulse-width-modulated output signal;
        a low-pass filter, operating at a second clock frequency lower than the first clock frequency; and
        detection logic, for comparing a signal corresponding to a modulated bitstream after passing through the low-pass filter to a threshold value, and for issuing the fault signal responsive to the comparing.

2. The amplifier of claim 1, wherein the sigma-delta modulator has an input coupled to an output of the low-pass filter, and wherein the detection logic has an input coupled to an output of the sigma-delta modulator.

3. The amplifier of claim 1, wherein the sigma-delta modulator has an input receiving a signal corresponding to the pulse-width-modulated output signal;
    and wherein the low-pass filter comprises a digital filter, and filters the modulated bitstream.

4. The amplifier of claim 3, wherein the sigma-delta modulator comprises:
    a difference circuit for generating a difference signal corresponding to a difference between the pulse-width-modulated output signal and a feedback signal;
    an integrator, for integrating the difference signal; and
    a quantizer, for generating discrete digital levels corresponding to the integrated difference signal;
    wherein the feedback signal corresponds to the discrete digital levels;
    and wherein the modulated bitstream corresponds to a sequence of the discrete digital levels at the first clock frequency.

5. The amplifier of claim 4, wherein the amplifier comprises a plurality of pulse-width-modulators, each associated with an audio channel;
    and wherein the DC detection logic further comprises:
        a multiplexer, for receiving a plurality of pulse-width-modulated output signals from the plurality of pulse-width-modulators, and for applying a selected one of the plurality of pulse-width-modulated output signals at its output responsive to a select signal.

6. The amplifier of claim 4, wherein the difference circuit comprises:
    an operational transconductance amplifier, for generating a current corresponding to the pulse-width-modulated output signal and applying the current to a summing node; and
    a chop circuit, for applying a current to the summing node corresponding to the feedback signal;
    wherein the integrator comprises:
        a capacitor, coupled to the summing node;
    and wherein the quantizer comprises:
        a comparator, having an input coupled to the summing node; and
        a flip-flop having an input coupled to an output of the comparator, clocked by a first clock signal at the first clock frequency, and having an output for presenting the sequence of discrete digital levels and for presenting the feedback signal.

7. The amplifier of claim 4, wherein the difference circuit comprises:
    a first current source, coupled to a power supply voltage;
    a second current source, coupled to a reference voltage;

a first switch, for selectively coupling the first current source to a summing node responsive to a control signal;

a second switch, for selectively coupling the second current source to the summing node responsive to a control signal; and combinational logic for generating the control signals to the first and second switches responsive to the pulse-width-modulated output signal and the feedback signal; and wherein the integrator comprises:
  a capacitor, coupled to the summing node; and wherein the quantizer comprises:
  a comparator, having an input coupled to the summing node; and
  a flip-flop having an input coupled to an output of the comparator, clocked by a first clock signal at the first clock frequency, and having an output for presenting the sequence of discrete digital levels and for presenting the feedback signal.

8. The amplifier of claim 1, wherein the low-pass filter comprises:
  an n-bit up/down counter, having a control input coupled to the sigma-delta modulator, having a clock input for receiving a clock signal at the first clock frequency, and having an output, the up/down counter for incrementing or decrementing its contents according to a digital level at its control input and responsive to the clock signal;
  comparison logic, having an input coupled to the output of the up/down counter, for comparing the contents of the up/down counter with a threshold value; and
  a flip-flop, having an input coupled to an output of the comparison logic, and having a clock input coupled to receive a clock signal at the second clock frequency;
  wherein the fault signal corresponds to the state of the flip-flop.

9. The amplifier of claim 8, wherein the low-pass filter further comprises:
  a second counter that advances its contents responsive to clock signal at the first frequency, and having an output; and
  a decoder, having an input coupled to the output of the second counter, for generating a clock signal at the second clock frequency responsive to the contents of the second counter reaching a trip point.

10. The amplifier of claim 9, wherein the amplifier comprises a plurality of pulse-width-modulators, each associated with an audio channel;
  and wherein the DC detection logic further comprises:
    a multiplexer, for receiving a plurality of pulse-width-modulated output signals from the plurality of pulse-width-modulators, and for applying a selected one of the plurality of pulse-width-modulated output signals at its output responsive to a select signal.

11. The amplifier of claim 9, wherein the second counter has a number of bits corresponding to n+k, where k is an integer corresponding to the base 2 logarithm of the number of pulse-width-modulators in the amplifier;
  and wherein the decoder has an output for presenting a control signal to the multiplexer corresponding to the k most significant bits of its contents.

12. The amplifier of claim 1, wherein the low-pass filter is a sinc filter.

13. The amplifier of claim 12, wherein the low-pass filter is a first-order sinc filter.

14. The amplifier of claim 12, wherein the low-pass filter is a sinc filter of higher than first order.

15. The amplifier of claim 1, further comprising:
  a pair of half-bridges, for driving a load responsive to the pulse-width-modulated signal;
  wherein the DC detection logic has an input for receiving the pulse-width-modulated signals from a point in the amplifier prior to the pair of half-bridges.

16. A method of amplifying an audio signal, comprising the steps of:
  receiving an analog input signal;
  generating at least one pulse-width-modulated signal responsive to the analog input signal;
  applying the pulse-width-modulated signal to an H-bridge to drive a speaker;
  generating a filtered modulated signal corresponding to the pulse-width-modulated signal, using a sigma-delta modulator at a first clock frequency and a digital low pass filter at a second clock frequency;
  comparing the filtered modulated signal with a threshold value; and
  generating a DC fault signal responsive to the filtered modulated signal exceeding the threshold value.

17. The method of claim 16, further comprising:
  stopping the applying step responsive to the DC fault signal.

18. The method of claim 16, wherein the generating step comprises:
  applying the digital low pass filter to the pulse-width-modulated signal; and
  then modulating the filtered signal with the sigma-delta modulator.

19. The method of claim 16, wherein the generating step comprises:
  modulating the pulse-width-modulated signal with the sigma-delta modulator; and
  then filtering the modulated signal with the digital low-pass filter.

20. The method of claim 19, wherein the modulating step comprises:
  generating a difference signal corresponding to a difference between the pulse-width-modulated signal and a feedback signal;
  integrating the difference signal;
  comparing the difference signal with a reference level; and
  latching a result of the step of comparing the difference signal with the reference level, at the first clock frequency, to produce the modulated signal and the feedback signal.

21. The method of claim 20, wherein the step of generating the difference signal comprises:
  selectively charging and discharging a summing node responsive to a logical combination of the pulse-width-modulated signal and the feedback signal.

22. The method of claim 19, wherein the filtering step comprises:
  incrementing or decrementing an up/down counter responsive to a current state of the modulated signal and to a clock signal at the first clock frequency;
  wherein the comparing step compares the contents of the up/down counter to a threshold value;
  and wherein the filtering step further comprises:
    latching a result of the step of comparing the contents of the up/down counter, at the second clock frequency, to produce a signal corresponding to the DC fault signal.

23. The method of claim 22, wherein the filtering step further comprises:
   advancing a second counter with each cycle of the clock signal at the first clock frequency; and
   responsive to the contents of the second counter reaching a trip level, issuing a clock signal at the second clock frequency and resetting the contents of the up/down counter.

24. The method of claim 23, wherein the generating step generates a plurality of pulse-width-modulated signals, each associated with one of a plurality of audio channels;
   and further comprising:
   selecting one of the plurality of pulse-width-modulated signals for the step of generating the difference signal.

25. The method of claim 24, wherein the selecting step is performed responsive to a most significant portion of the contents of the second counter.

26. The method of claim 16, wherein the generating step generates a plurality of pulse-width-modulated signals, each associated with one of a plurality of audio channels;
   wherein the applying steps applies each of the plurality of pulse-width-modulated signals to one of a plurality of H-bridges to drive a speaker corresponding to the audio channel.

27. The method of claim 26, wherein the generating and applying steps are performed for each of the plurality of audio channels;
   and further comprising:
   stopping the applying step for all of the plurality of audio channels responsive to the generating step generating the DC fault signal for any of the plurality audio channels.

28. The method of claim 16, wherein the generating and applying steps are performed during the step of applying the pulse-width-modulated signal to an H-bridge.

* * * * *